United States Patent [19]

Tsukada

[11] 4,352,725
[45] Oct. 5, 1982

[54] DRY ETCHING DEVICE COMPRISING AN ELECTRODE FOR CONTROLLING ETCH RATE

[75] Inventor: Tsutomu Tsukada, Fuchu, Japan
[73] Assignee: Anelva Corporation, Fuchu, Japan
[21] Appl. No.: 215,804
[22] Filed: Dec. 12, 1980

[30] Foreign Application Priority Data

Dec. 15, 1979 [JP] Japan .................... 54/162178

[51] Int. Cl.³ .................... C23C 15/00; C23F 1/00
[52] U.S. Cl. ........................ 204/192 E; 204/298; 156/345; 156/643
[58] Field of Search ............ 204/192 E, 192 EC, 298; 156/345, 643

[56] References Cited

U.S. PATENT DOCUMENTS

| | | | |
|---|---|---|---|
| 3,730,873 | 5/1973 | Pompei et al. | 204/298 |
| 3,932,232 | 1/1976 | Labuda et al. | 204/192 E |
| 4,222,838 | 9/1980 | Bhagat et al. | 204/192 E |
| 4,253,907 | 3/1981 | Parry et al. | 156/643 |
| 4,298,443 | 11/1981 | Maydan | 204/192 E |

FOREIGN PATENT DOCUMENTS 53-68171 6/1978 Japan ................ 204/192 E

OTHER PUBLICATIONS

B. N. Chapman et al., "Plasma Etching of a Positively Biased Wafer", *IBM Tech. Disc. Bull.*, vol. 22, pp. 1175–1176, (1979).

B. N. Chapman, "Triode Systems for Plasma Etching", *IBM Tech. Disc. Bull.*, vol. 22, pp. 5006–5007, (1979).

*Primary Examiner*—Aaron Weisstuch
*Attorney, Agent, or Firm*—Laff, Whitesel, Conte & Saret

[57] ABSTRACT

In a dry etching device comprising a first electrically grounded electrode plate and a second electrode plate opposite to the first electrode plate in a hollow space and supplied with a voltage of a predetermined frequency, a control electrode member is placed in the hollow space between the first and the second electrode plates and is connected to a d.c. voltage source for a controllable d.c. voltage. The etch rate is electrically adjustable to a desired rate by the d.c. voltage. The control electrode member may be a conductive rod projected into the hollow space or a conductive flat mesh substantially parallel to the first and the second electrode plates. Alternatively, the member may be an annular ring-shaped conductor surrounding the gas plasma developed between the first and the second electrode plates. Specimens to be etched may be placed on both of the electrode plates when the etch rate is adjusted to the desired rate by the use of the member.

6 Claims, 4 Drawing Figures

DRY ETCHING DEVICE COMPRISING AN ELECTRODE FOR CONTROLLING ETCH RATE

BACKGROUND OF THE INVENTION

This invention relates to a dry etching device for etching a specimen by the use of a gas plasma.

It is a recent trend that a dry etching device of the type described is used for semiconductor device fabrication instead of a sophisticated etching device using any etching solution. This is because no problem takes place in the dry etching device as regards waste lye disposal. Furthermore, it is possible to delineate fine patterns.

In "Digest of Technical Papers of the 11th Conference (1979 International) on Solid State Devices," (Tokyo, August 1979), p. 19, Hikou Shibayama et al. proposed a dry etching device comprising a chamber defining therein a hollow space, a first electrode grounded and placed in the hollow space, a second electrode opposite to the first electrode in the hollow space, and a floating grid placed between the first and the second electrodes and insulated therefrom. Specimens to be etched are placed on the second electrode. The hollow space is filled with a reactive gas after being exhausted. A voltage of a high frequency is applied between the first and the second electrodes. In this device, a high etch rate is accomplished by the use of the floating grid. However, it is difficult to electrically and controllably adjust the etch rate to a desired value except that the high frequency voltage is controlled. In addition, only a small number of specimens can be etched at one time with the device.

SUMMARY OF THE INVENTION

It is, therefore, an object of this invention to provide a dry etching device wherein the etch rate is electrically and controllably adjustable to a desired rate.

It is aother object of this invention to provide a dry etching device of the type described, wherein a large number of specimens are capable of being etched at the same time.

A dry etching device to which this invention is applicable is used for etching a specimen by means of a gas plasma. The device comprises a chamber defining therein a hollow space to be exhausted and then filled with a preselected reactive gas, a first electrode plate positioned in the gas-filled space, a second electrode opposite to the first electrode plate, and first means for applying a voltage of a predetermined frequency to develop the gas plasma in the gas-filled space between the first and the second electrodes. The gas plasma has a plasma potential dependent on the voltage and the reactive gas. A specimen to be etched is placed on one of the electrodes, where it is etched at a rate which is determined by the plasma potential. According to this invention, the device comprises a control electrode member in the hollow space between but not touching either the specimen or the first and the second electrodes. A second means applies a controllable d.c. voltage to the control electrode member to control the plasma potential. The plasma potential is controlled by the d.c. voltage in order to regulate the etch rate.

DESCRIPTION OF THE PREFERRED EMBODIMENTS

Figure 1:
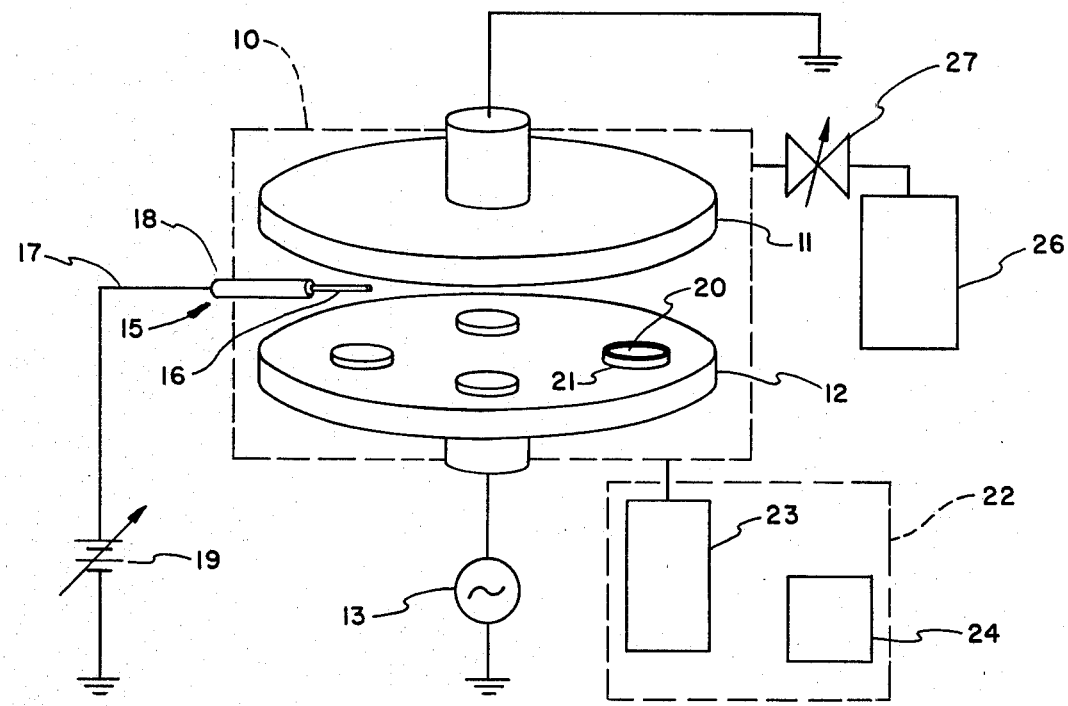
FIG. 1 diagrammatically shows a perspective view of a dry etching device according to a first embodiment of this invention together with vacuum and gas feeding systems.

Referring to FIG. 1, a dry etching device according to a first embodiment of this invention comprises a chamber 10 defining therein a hollow space and first and second flat electrodes 11 and 12 of a disc shape both of which are placed in the hollow space. The second electrode 12 is opposite and substantially parallel to the first electrode 11. In FIG. 1, the first electrode 11 is grounded while the second electrode 12 is connected to an electric power source 13. The distance between the first and the second electrodes 11 and 12 is usually selected between 40 mm and 100 mm. The electric power source 13 is for applying voltage of a predetermined frequency to develop a gas plasma in the hollow space between the first and the second electrodes 11 and 12 when the hollow space is evacuated and then filled with a preselected reactive gas, such as carbon tetrachloride, carbon tetrafluoride, or the like. Herein, the carbon tetrachloride should be heated to be vaporized when used as the reactive gas. The voltage is between 100 and 500 volts. The predetermined frequency is selected between several hundreds of kilohertz and several tens of megahertz.

Further referring to FIG. 1, the dry etching device comprises a control electrode member 15 in the hollow space between the first and the second electrodes 11 and 12. In the example being illustrated, the control electrode member 15 comprises a conductive rod portion 16 projected into the hollow space substantially in parallel to the first and the second electrodes 11 and 12 and a lead portion 17 electrically connected to the rod portion 16 and extended outside the chamber 10. The control electrode member 15 is covered with an insulator sleeve 18 at the portion passing through the chamber wall. An adjustable d.c. voltage source 19 is connected between the lead portion 17 and ground to apply a controllable d.c. voltage to the control electrode member 15.

In this embodiment, a plurality of specimens 20 to be etched may be located on each of the first and the second electrodes 11 and 12, as will become clear as the description proceeds. Therefore, a plurality of holders are attached to each of the first and the second electrodes 11 and 12, as symbolized by a thick line 21.

After locating the specimens 20 on both of the first and the second electrodes 11 and 12, the chamber 10 is exhausted by the use of vacuum system 22 coupled to the chamber 10. In FIG. 1, the vacuum system 22 comprises a diffusion pump 23 connected to the chamber 10 and a rotary pump 24 connected to the diffusion pump 23 in series. The reactive gas is fed into the chamber 10 from a reservoir 26 through a mass flow controller 27 after the hollow space is exhausted. The reservoir 26 and the mass flow controller 27 serve as a feeding system for the reactive gas. The power source 13 is energized to apply the high frequency voltage between the first and the second electrodes 11 and 12. As a result, the gas plasma is developed in the space between the first and the second electrodes 11 and 12 and the reactive gas is dissociated by the gas plasma into dissociated molecules. The specimens 20 are exposed to the dissociated molecules and ions appearing in the gas plasma, to be etched thereby. As usual, the plasma potential of the gas plasma is dependent on the voltage of the power source 13 and the reactive gas, namely, the type of the gas and its pressure. In the embodiment shown, it is possible to control the plasma potential by the controllable d.c. voltage supplied from the d.c. voltage source to the control electrode member 15. That is, the plasma potential is changeable in accordance with the controllable d.c. voltage. This means that in this embodiment the etch rate is controllable by the d.c. voltage.

Figure 2:
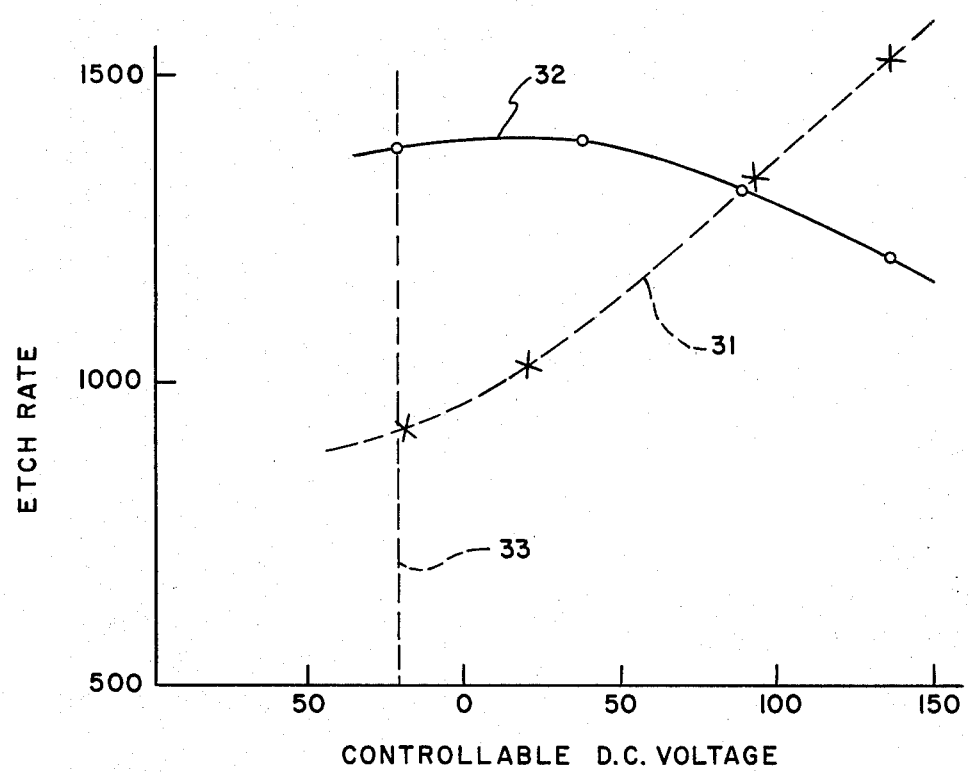
FIG. 2 shows a graphical representation for describing characteristics of the first embodiment.

Referring to FIG. 2, wherein the abscissa and the ordinate represent the controllable d.c. voltage (volt) on the control electrode member 15 and the etch rate (angstroms/minute), respectively, curves 31 and 32 show d.c. voltage versus etch rate characteristics of the dry etching device according to the first embodiment of this invention. More particularly, curves 31 and 32 are the characteristics obtained when the specimens 20 are placed on the first and the second electrodes 11 and 12, respectively. Measurement conditions are enumerated hereinafter. An etching device of 150 watts was used which has first and second electrodes 11 and 12 of 280 mm in diameter. The distance between the first and second electrodes 11 and 12 was about 40 mm. Control electrode member 15 comprised a rod portion 16 of platinum wire which was 40 mm in length and 0.5 mm in diameter and which was extended at a middle portion between the first and second electrodes 11 and 12. The control electrode member 15 was supplied with a voltage of about 100 volts at 13.56 MHz. On the first and second electrodes 11 and 12, specimens 20 of aluminum were placed to be etched by the device. As the reactive gas, carbon tetrachloride gas was filled at a pressure of $6 \times 10^{-2}$ Torr in the hollow space. Under these circumstances, the controllable d.c. voltage on the control electrode 15 was varied between $-20$ volts and 150 volts by changing the d.c. voltage source 19.

As readily understood from curve 32, the etch rate is gradually reduced with an increase of the d.c. voltage when the specimens 20 are placed on the second electrode 12 connected to the electric power source 13. On the other hand, the etch rate is raised with the controllable d.c. voltage when the specimens 20 are placed on the first electrode 11 which is grounded, as shown by the curve 31 in FIG. 2. Therefore, it is possible to adjust the etch rate to a desired value by controlling the plasma potential.

Further referring to FIG. 2, the curve 31 intersects the curve 32 at a d.c. voltage of 90 volt. This implies that the etch rate on the first electrode 11 becomes equal to that on the second electrode 12. From this fact, it is understood that two sets of specimens are capable of being simultaneously etched at the same rate by adjusting the controllable d.c. voltage. Consequently, the device according to the first embodiment can simultaneously process twice as many specimens as a conventional dry etching device which has an uncontrollable or floating grid, as described in the preamble of the instant specification. More specifically, the uncontrollable grid is usually kept at a potential shown by a broken line 33 in FIG. 2. The etch rate on the first electrode 11 is considerably different from that on the second electrode 12, as understood from the curves 31 and 32.

Therefore, the specimens 20 should be placed on either of the first and second electrodes 11 and 12, with the conventional dry etching device of the type described.

It is mentioned here that the specimens 20 on the first electrode 11 are bombarded by ions different from those incident to specimens 20 on the second electrode 12. The characteristics of semiconductor devices are adversely affected by specific ion bombardment. Therefore, it is very useful for semiconductor device fabrication that both the first and second electrodes 11 and 12 can be utilized to etch the specimens 20.

Figure 3:
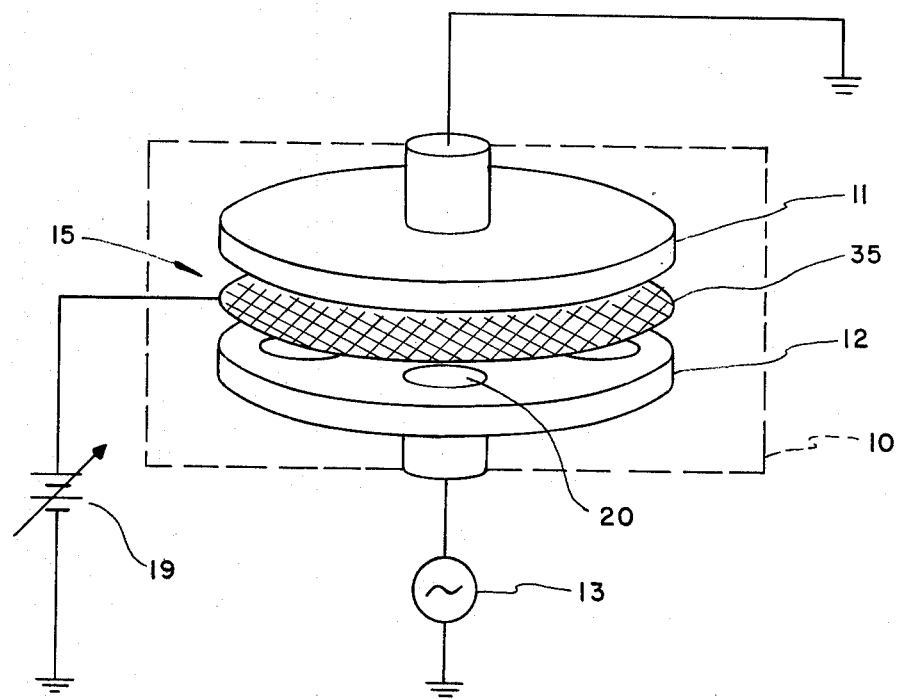
FIG. 3 diagrammatically shows a perspective view of a dry etching device according to a second embodiment of this invention with vacuum and gas feeding systems omitted therefrom.

Referring to FIG. 3, a dry etching device according to a second embodiment of this invention is similar to that illustrated with reference to FIG. 1 except that the control electrode member 15 comprises a conductive flat mesh 35 extended between and substantially parallel to the first and the second electrodes 11 and 12. The flat mesh 35 may be wider or narrower in size than the first and the second electrodes 11 and 12. The variable d.c. voltage source 19 is connected between the conductive flat mesh 35 and ground. The specimens 20 may be placed on either or both of the first and second electrodes 11 and 12, as is the case with the first embodiment illustrated in FIG. 1. The dry etching device according to the second embodiment can etch the specimens 20 in a similar manner to the first embodiment.

Figure 4:
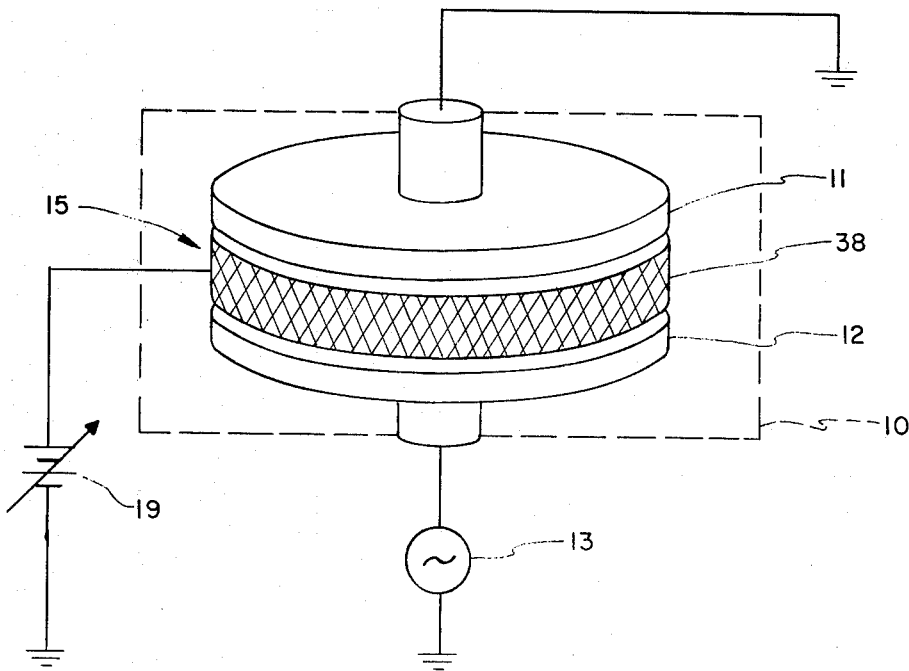
FIG. 4 is a similar view of a dry etching device according to a third embodiment of this invention.

Referring to FIG. 4, a dry etching device according to a third embodiment of this invention comprises the control electrode member 15 being in the form of a ring-shaped conductor 38 placed in the hollow space between the first and the second electrodes 11 and 12. The ring-shaped conductor 38 surrounds the gas plasma developed between the first and the second electrodes 11 and 12. In this embodiment, the ring-shaped conductor 38 has an annular side surface which is extended along the gas plasma and which is interlaced in a net fashion. With the third embodiment, it is possible to accomplish similar effects to those illustrated with reference to FIGS. 1 and 3.

While this invention has thus far been described in conjunction with a few preferred embodiments thereof, it is possible for those skilled in the art to practice this invention in various manners. For example, a dielectric plate may be attached to either or both of the first and the second electrodes 11 and 12 to activate dissociation of the reactive gas. The mesh or the ring-shaped conductor illustrated in FIGS. 3 or 4 may be formed by a thin tube. In this case, when a coolant is caused to flow through the thin tube, the control electrode member 15 can be cooled by the coolant without any other cooling device. The ring-shaped conductor 38 may be an annular plate. Finally, the second electrode 12 may be a coil placed outside the chamber and wound around the chamber 10.

What is claimed is:

1. A method of equalizing the etch rates in a device for dry etching a specimen by a use of a gas plasma, said method comprising the steps of:
   (a) exhausting a chamber having spaced parallel electrodes contained in an enclosed hollow space within said chamber;
   (b) placing at least one specimen to be etched on each of said electrodes, the etch rate of a specimen on one electrode differing considerably from the etch rate of a specimen on the other electrode;
   (c) filling said space with a preselected reactive gas;
   (d) applying an a.c. electric voltage of a predetermined frequency across said electrodes to develop said gas plasma in said gas-filled space, said gas plasma having a plasma potential dependent on the electric voltage applied across it and on said reactive gas; and (e) controlling said plasma potential by applying an adjustable d.c. voltage to a control electrode member position in said hollow space between said first and said second electrodes, said control electrode being out of contact with said specimen, thereby equalizing the etch rates of specimens on both electrodes.

2. A dry etching device for etching at least one specimen by the use of a gas plasma, said device comprising a chamber defining therein a hollow space to be exhausted and then filled with a preselected reactive gas; a first flat electrode in said gas-filled space; a second flat electrode opposite said first electrode; each of said first and said second flat electrodes having accompanying means for holding said at least one specimen thereon; first means for applying an electric voltage of a predetermined frequency to develop said gas plasma in said gas-filled space between said first and said second electrodes; said gas plasma having a plasma potential dependent on said electric voltage and said reactive gas, wherein the device further comprises a control electrode member in said hollow space between said first and said second electrodes and second means for applying a controllable d.c. voltage to said control electrode member to control said plasma potential.

3. A dry etching device as claimed in claim 2, wherein said second electrode is placed in said hollow space substantially in parallel to said first electrode.

4. A dry etching device as claimed in claim 2, wherein said first and second electrodes are spaced parallel plates, and said control electrode member comprises a conductive rod projecting into said gas-filled space substantially in parallel with said first and said second flat electrodes.

5. A dry etching device as claimed in claim 2, wherein said first and second electrodes are spaced parallel plates, and said control electrode member comprises a conductive flat mesh held in said gas-filled space between said first and said second flat electrodes substantially parallel thereto.

6. A dry etching device as claimed in claim 2, wherein said first and second electrodes are spaced parallel plates, and said control electrode member comprises a ring-shaped conductor arranged in said gas-filled space to surround said gas plasma developed between said first and said second flat electrodes.

* * * * *